(12) United States Patent
Lee et al.

(10) Patent No.: US 7,952,911 B2
(45) Date of Patent: May 31, 2011

(54) SRAM CELL ARRAY STRUCTURE

(75) Inventors: Cheng-Hung Lee, Hsinchu (TW);
Ching-Wei Wu, Hsin Chu (TW);
Hung-Jen Liao, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 431 days.

(21) Appl. No.: 12/111,905

(22) Filed: Apr. 29, 2008

(65) Prior Publication Data

US 2009/0268501 A1    Oct. 29, 2009

(51) Int. Cl.
*G11C 11/00* (2006.01)

(52) U.S. Cl. .................. 365/154; 365/49.11; 365/49.1; 365/189.16

(58) Field of Classification Search .......... 365/154, 365/49.11, 49.1, 189.16
See application file for complete search history.

(56) References Cited

U.S. PATENT DOCUMENTS

| 2006/0262628 A1* | 11/2006 | Nii et al. ............. 365/226 |
| 2008/0112212 A1* | 5/2008 | Wang et al. .......... 365/154 |
| 2009/0116308 A1* | 5/2009 | Van Winkelhoff et al. .......... 365/189.14 |

FOREIGN PATENT DOCUMENTS

CN    101064297 A    10/2007

OTHER PUBLICATIONS

China Office Action dated Sep. 14, 2010.

* cited by examiner

*Primary Examiner* — Vu A Le
*Assistant Examiner* — Han Yang
(74) *Attorney, Agent, or Firm* — K&L Gates LLP

(57) ABSTRACT

This invention discloses a static random access memory (SRAM) cell array structure which comprises a first and second bit-line coupled to a column of SRAM cells, the first and second bit-lines being substantially parallel to each other and formed by a first metal layer, and a first conductive line being placed between the first and second bit-lines and spanning across the column of SRAM cells without making conductive coupling thereto, the first conductive line being also formed by the first metal layer.

18 Claims, 5 Drawing Sheets

SRAM CELL ARRAY STRUCTURE

BACKGROUND

The present invention relates generally to static random access memory (SRAM), and, more particularly, to SRAM cell array structure.

Semiconductor memory devices include, for example, static random access memory, or SRAM, and dynamic random access memory, or DRAM. DRAM memory cell has only one transistor and one capacitor, so it provides a high degree of integration. But DRAM requires constant refreshing, its power consumption and slow speed limit its use mainly for computer main memories. SRAM cell, on the other hand, is bi-stable, meaning it can maintain its state indefinitely as long as an adequate power is supplied. SRAM can operate at a higher speed and lower power dissipation, so computer cache memories use exclusively SRAMs. Other applications include embedded memories and networking equipment memories.

One well-known conventional structure of a SRAM cell is a six transistor (6T) cell that comprises six metal-oxide-semiconductor (MOS) transistors. Briefly, a 6T SRAM cell 100, as shown in FIG. 1, comprises two identical cross-coupled inverters 102 and 104 that form a latch circuit, i.e., one inverter's output connected to the other inverter's input. The latch circuit is connected between a power and a ground. Each inverter 102 or 104 comprises a NMOS pull-down transistor 115 or 125 and a PMOS pull-up transistor 110 or 120. The inverter's outputs serve as two storage nodes C and D, when one is pulled to low voltage, the other is pulled to high voltage. A complementary bit-line pair 150 and 155 is coupled to the pair of storage nodes C and D via a pair of pass-gate transistors 130 and 135, respectively. The gates of the pass-gate transistors 130 and 135 are commonly connected to a word-line 140. When the word-line voltage is switched to a system high voltage, or Vcc, the pass-gate transistors 130 and 135 are turned on to allow the storage nodes C and D to be accessible by the bit-line pair 150 and 155, respectively. When the word-line voltage is switched to a system low voltage, or Vss, the pass-gate transistors 130 and 135 are turned off and the storage nodes C and D are essentially isolated from the bit lines, although some leakage can occur. Nevertheless, as long as Vcc is maintained above a threshold, the state of the storage nodes C and D is maintained indefinitely.

Referring again to FIG. 1, during a data-hold operation, i.e., the SRAM cell 100 is neither read nor written, both bit-lines 150 and 155 are clamped to the Vcc. When writing the SRAM cell 100, one of the bit-line pair, 150 for instance, turns to a ground (Vss), while the other bit-line 155 remains at the Vcc. The Vss at the bit-line 150 will force the node C to the Vss regardless its previous state. That is to write lower voltage to the node C. If intending to write lower voltage to the node D, the bit-line 155 will swing to the Vss while the bit-line 150 remains at the Vcc. How fast the SRAM cell can be written depends on the voltage difference between the Vss and Vcc. With modern process technology shrinking transistor size as well as lowering the Vcc, the SRAM cell writing speed becomes an issue.

As such, what is desired is a SRAM cell array structure that can enhance the voltage difference between the two bit-lines during a write operation.

SUMMARY

This invention discloses a static random access memory (SRAM) cell array structure. According to one embodiment of the present invention, the SRAM cell array structure comprises a first and second bit-line coupled to a column of SRAM cells, the first and second bit-lines being substantially parallel to each other and formed by a first metal layer, and a first conductive line being placed between the first and second bit-lines and spanning across the column of SRAM cells without making conductive coupling thereto, the first conductive line being also formed by the first metal layer.

According to another embodiment, the SRAM cell array structure further comprises a second conductive line formed by the first metal layer and being placed between the first conductive line and one of the bit-line pairs, the second conductive line having no conductive coupling to the SRAM cells.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein.

DESCRIPTION

The present invention discloses a novel static random access memory (SRAM) cell array that can enhance voltage split between a bit-line (BL) and a bit-line-bar (BLB) during a write operation, so that the writing speed and robustness are improved.

Figure 1:
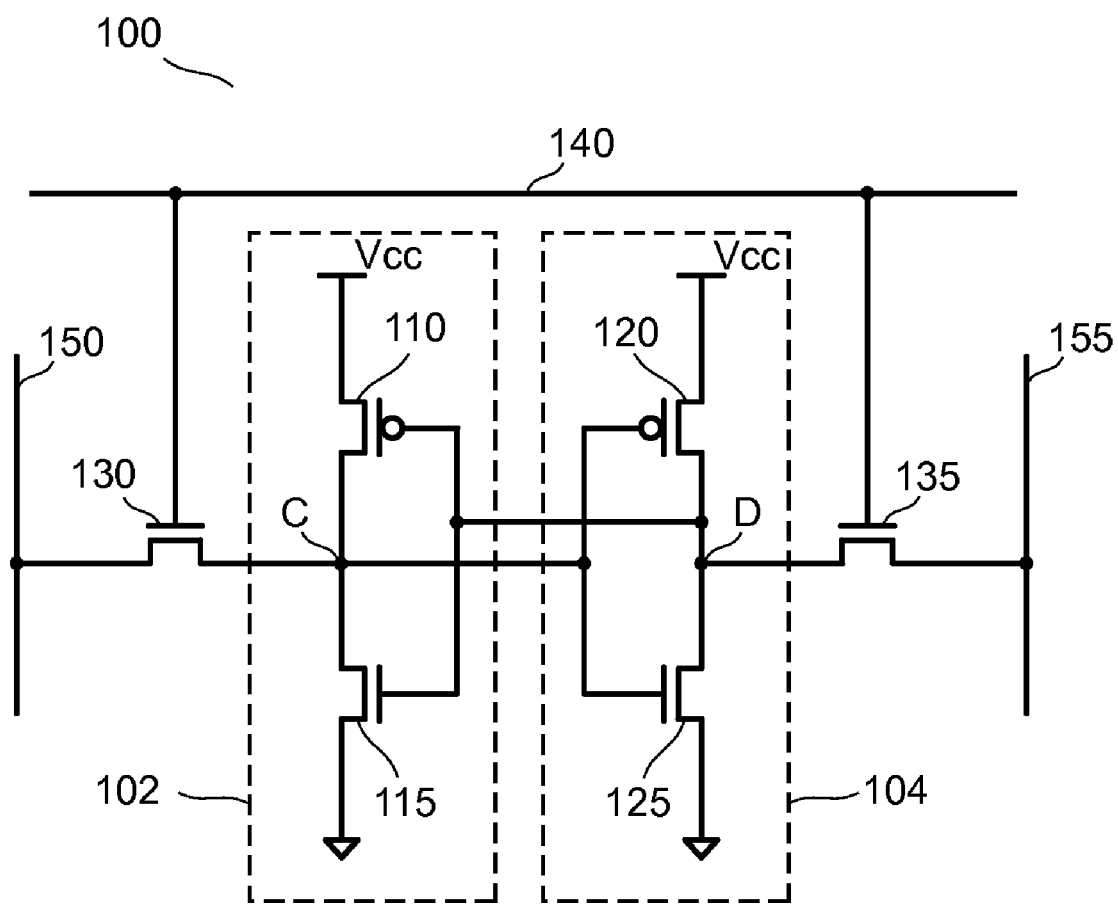
FIG. 1 is a schematic diagram illustrating a conventional 6-T SRAM cell.
Figure 2:
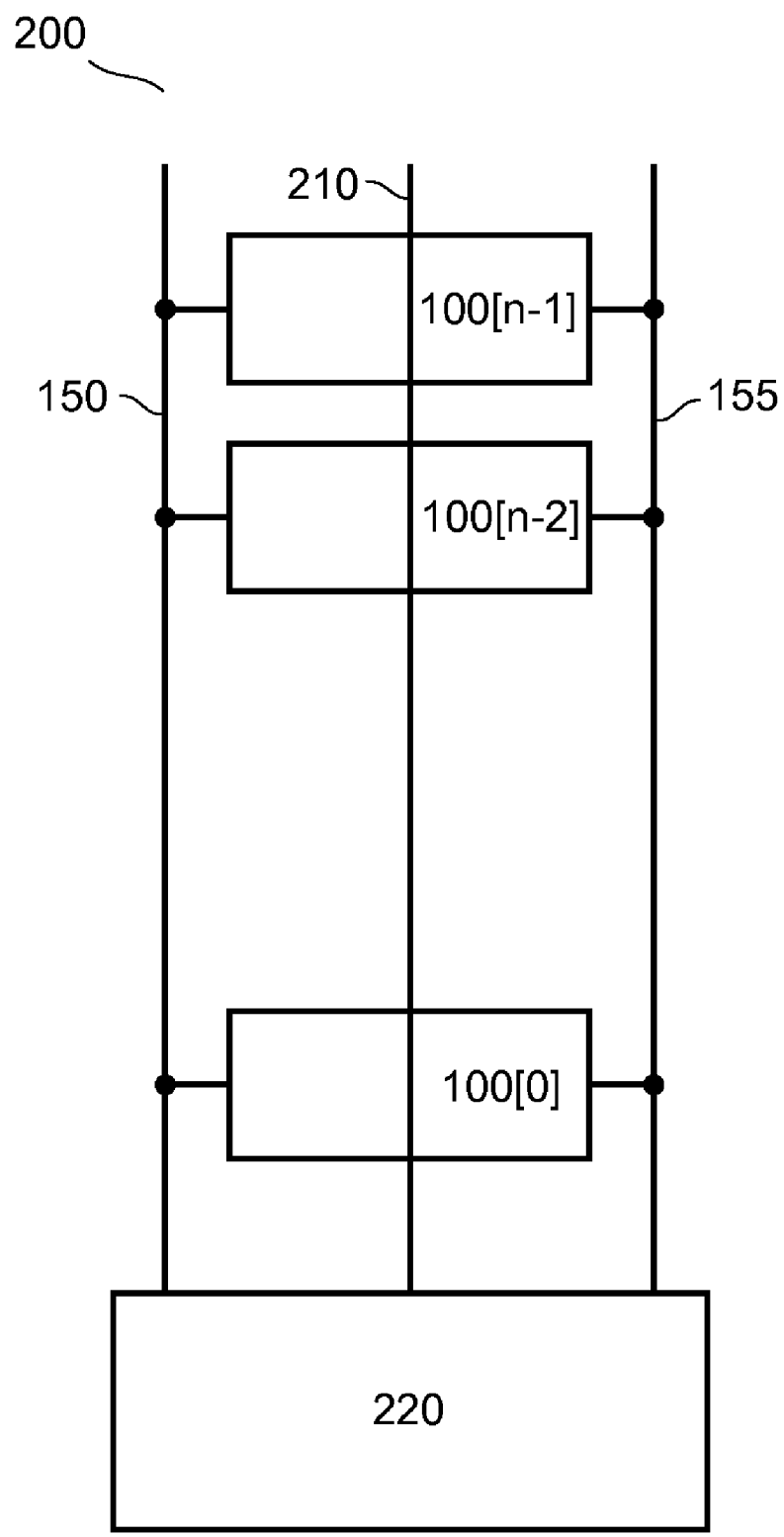
FIG. 2 is a schematic diagram illustrating a SRAM cell array with a write assist line according to an embodiment of the present invention.

FIG. 2 is a schematic diagram illustrating a SRAM cell array with a write assist line according to an embodiment of the present invention. A column of n number of SRAM cells 100[0:n−1] are connected to a pair of parallel bit-lines 150 and 155. Typically the bit-line pair 150 and 155 is layout in the same metal layer. Since SRAM cell pitch are normally limited by the active regions of the SRAM cell transistors, there should be enough room to layout an write assist line 210 running parallel to the bit-lines 150 and 155 on the same metal layer as the bit-lines 150 and 155. Particularly when the SRAM cell is larger than the conventional 6T SRAM cell 100 shown in FIG. 1. For instance, 8-T SRAM cell, which has separate read and write port, has larger column pitch than the 6-T SRAM cell 100. The write assist line 210 does not have conductive coupling with the SRAM cells. It influences the bit-lines through capacitance coupling due to the close proximity of the bit-lines and the write assist line. The bit-lines 150 and 155 as well as the write assist line 210 are controlled by a write control circuit 220 which generate appropriate waveforms thereon.

Figure 3:
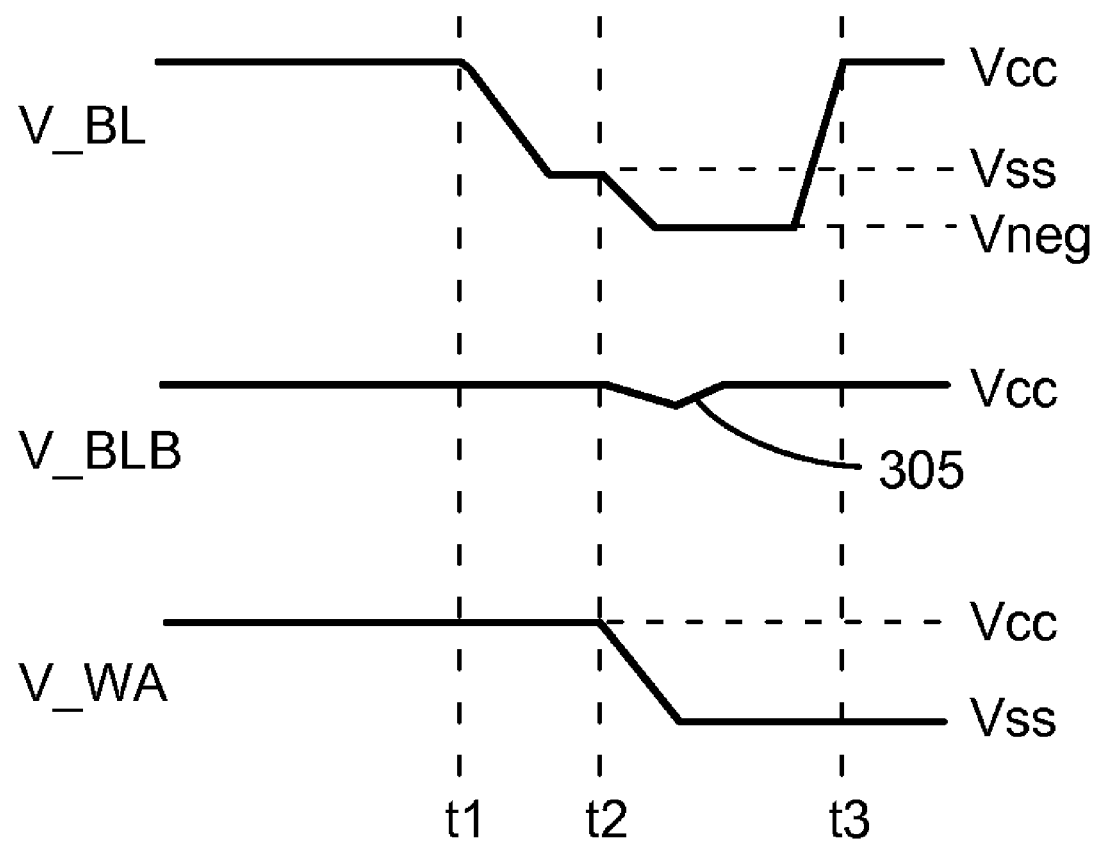
FIG. 3 is a waveform showing effects of the write assist line of FIG. 2 during a write operation.

FIG. 3 is a waveform showing effects of the write assist line 210 of FIG. 2 during a write operation. In this case, the bit-line 150 (BL) is supposed to force a lower voltage to the SRAM cells 100[0:n−1], and the bit-line 155 (BLB) remains at the Vcc. Prior to a write operation, the bit-line voltages, V_BL and V_BLB as well as the write assist line voltage, V_WA, are all clamped at the Vcc. The writing operation starts at a time t1 when the BL voltage V_BL, starts to decrease from the Vcc to the Vss. At a time t2, subsequent to the time t1 and at which time the V_BL has already been lowered to the Vss, the write assist line voltage V_WA starts to decrease from the Vcc to the Vss. Due to the proximity of the write assist line to the BL, the voltage lowering of the write assist line will be coupled to the BL, causing the V_BL to further decrease to a voltage, Vneg, which is lower than the Vss. Therefore, a voltage difference between the BL and BLB is (Vcc−Vneg) which is larger than the conventional (Vcc−Vss).

Referring again to FIG. 3, the coupling between BL and the write assist line also exists between the BLB and the write assist line, which can cause the BLB voltage V_BLB to dip by a certain amount 305. Such voltage dip 305, in effect, counteracts the benefit of the voltage lowering on the BL.

Figure 4:
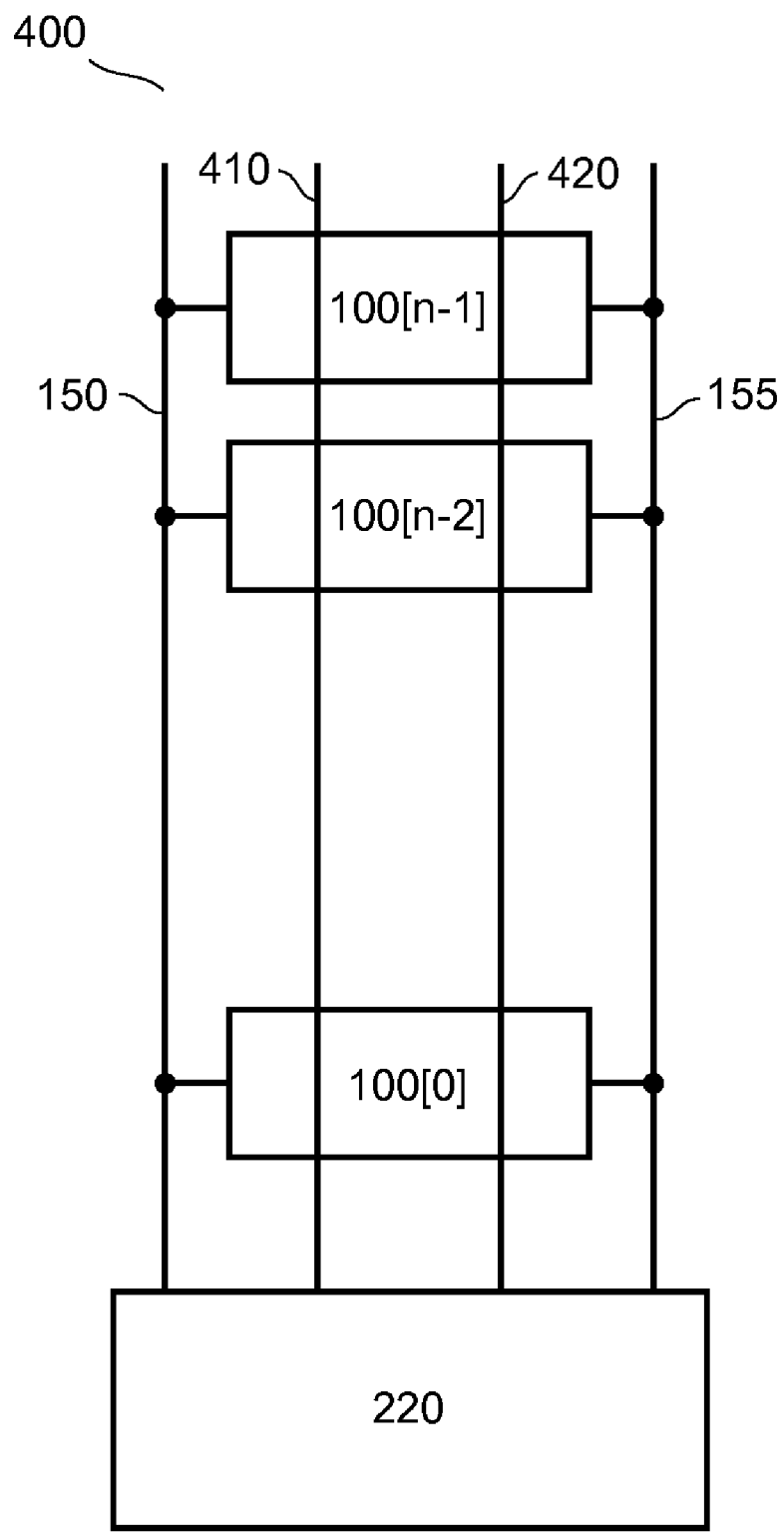
FIG. 4 is a schematic diagram illustrating a SRAM cell array with two write assist lines according to another embodiment of the present invention.

FIG. 4 is a schematic diagram illustrating a SRAM cell array having two write assist lines 410 and 420 according to another embodiment of the present invention. The write assist lines 410 and 420 run parallel to the bit-lines 150 and 155 with the write assist line 410 being closer to the bit-line 150 and the write assist line 420 being closer to the bit-line 155. The purpose of placing two write assist lines 410 and 420 is to insulate a write assist line from a far away bit-line. For instance, when the voltage of the bit-line 150 is intended to be lowered, the write assist line 410 will be lowered in the same manner as the write assist line 210 of FIG. 2. But the presence of another write assist line 420 insulates the write assist line 410 from affecting the bit-line 155.

Figure 5:
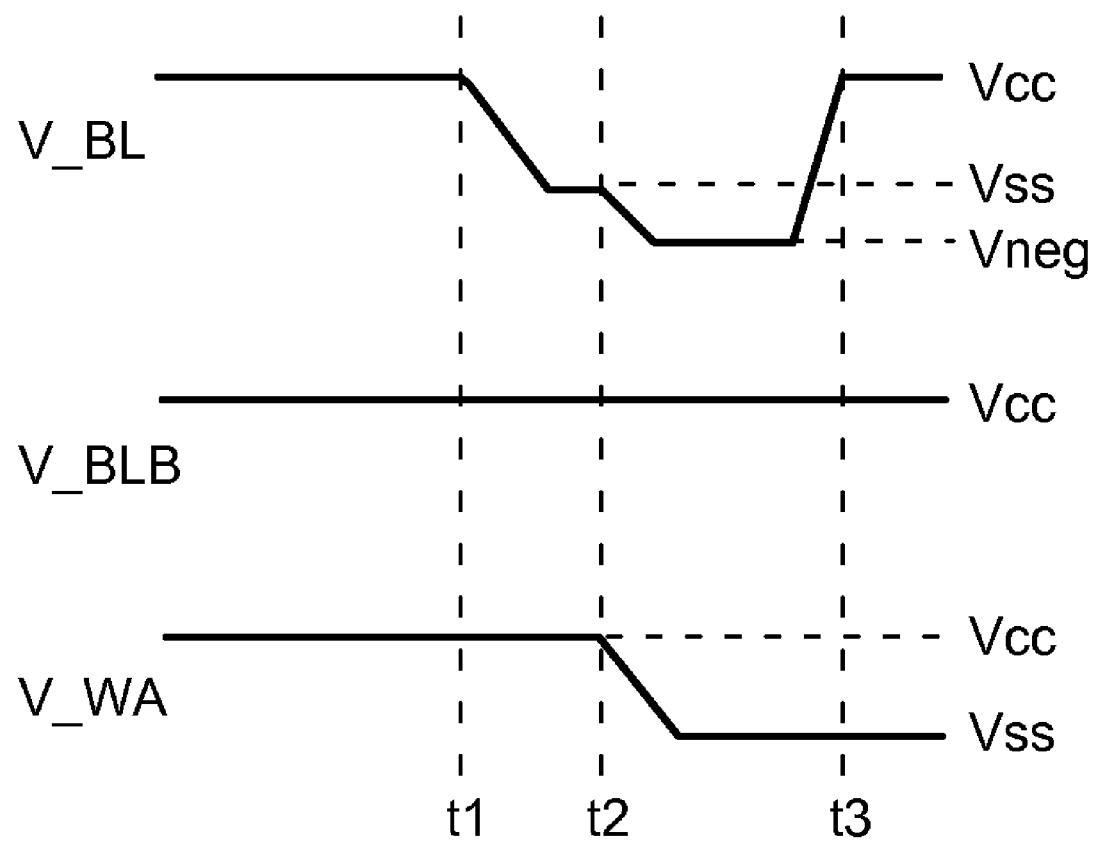
FIG. 5 is a waveform showing effects of the write assist lines of FIG. 4 during a write operation.

FIG. 5 is a waveform showing effects of the write assist lines 410 and 420 of FIG. 4 during a write operation. Assuming the voltage of bit-line 150 is represented by V_BL, the voltage of bit-line 155 is represented by V_BLB, and voltage of the write assist line 410 is represented by V_WA. In this case, the voltage of the write assist line 420 (not shown) stay at the Vcc. V_BL is extended to Vneg due to the coupling of the V_WA. But the write assist line 420 insulates the V_BLB from being coupled by V_WA, which stays at the Vcc throughout the write operation. Therefore, the bit-line pair 150 and 155 has all the benefit of expanded voltage split due to the coupling from the write assist line 410. Similarly, when the bit-line 155 is forced to the Vss during a write operation, the voltage of the write assist line 410 stays at the Vcc, and the write assist line 420 swings from the Vcc to the Vss during the write operation.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A static random access memory (SRAM) cell array structure comprising:
   a first and second conductive line coupled to a column of SRAM cells, the first and second conductive lines being substantially parallel to each other and formed by a first metal layer, wherein during a write operation, when voltage at the first conductive line decreases from a high voltage (Vcc) to a low voltage (Vss), voltage at the second line stays at the Vcc; and
   a third conductive line placed between the first and second conductive lines, and spanning across the column of SRAM cells without making conductive coupling thereto, the third conductive line being also formed by the first metal layer, wherein during the write operation, voltage at the third conductive line decreases from the Vcc to the Vss to further decrease the voltage of the first conductive line from the Vss to a voltage (Vneg) lower than the Vss.

2. The SRAM cell array structure of claim 1, wherein the first and second conductive line are bit-lines for the SRAM cells.

3. The SRAM cell array structure of claim 1, wherein the voltage swing at the third conductive line follows the voltage swing at the bit-line.

4. The SRAM cell array structure of claim 1, wherein the third conductive line is substantially parallel to the first and second conductive line.

5. The SRAM cell array structure of claim 1, wherein the SRAM cell has six or more transistors.

6. The SRAM cell array structure of claim 1 further comprises a fourth conductive line placed between the first and third conductive lines and spanning across the column of SRAM cells without making conductive coupling thereto, the fourth conductive line being formed by the first metal layer.

7. The SRAM cell array structure of claim 6, wherein during a write operation, voltage at the fourth conductive line stays at a high voltage (Vcc) while the third conductive line swings from the Vcc to a low voltage (Vss).

8. A static random access memory (SRAM) cell array structure comprising:
   a first and second bit-line coupled to a column of SRAM cells, the first and second bit-lines being substantially parallel to each other and formed by a first metal layer, wherein during a write operation, voltage at one of the bit-lines swings from a high voltage (Vcc) to a low voltage (Vss), while voltage at the other bit-line stays at the Vcc; and
   a first conductive line placed between the first and second bit-lines, and spanning across the column of SRAM cells without making conductive coupling thereto, the first conductive line being also formed by the first metal layer, wherein during the write operation, voltage at the first conductive line decreases from the Vcc to the Vss to further decrease the voltage at one of the bit-lines from the Vss to a voltage (Vneg) lower than the Vss.

9. The SRAM cell array structure of claim 8, wherein voltage at the first conductive line swings from the Vcc to the Vss following the voltage swing at the bit-line during the write operation.

10. The SRAM cell array structure of claim 8, wherein the first conductive line is substantially parallel to the bit-lines.

11. The SRAM cell array structure of claim 8, wherein the SRAM cell has six or more transistors.

12. The SRAM cell array structure of claim 8 further comprises a second conductive line placed between the conductive line and one of the bit-lines and spanning across the column of SRAM cells without making conductive coupling thereto, the second conductive line being formed by the first metal layer.

13. The SRAM cell array structure of claim 12, wherein during a write operation, voltage at the second conductive line stays at a high voltage (Vcc) while the first conductive line swings from the Vcc to a low voltage (Vss).

14. A static random access memory (SRAM) cell array structure, the SRAM cell having six or more transistors, the SRAM cell array structure comprising:
    a first and second bit-line coupled to a column of SRAM cells, the first and second bit-lines being substantially parallel to each other and formed by a first metal layer, wherein during a write operation, voltage at one of the bit-lines swings from a high voltage (Vcc) to a low voltage (Vss), while voltage at the other bit-line stays at the Vcc.; and
    a first conductive line placed between the first and second bit-lines, and spanning across the column of SRAM cells without making conductive coupling thereto, the first conductive line being also formed by the first metal layer, wherein during the write operation, voltage at the first conductive line decreases from the Vcc to the Vss to further decrease the voltage at one of the bit-lines from the Vss to a voltage (Vneg) lower than the Vss.

15. The SRAM cell array structure of claim 14, wherein voltage at the first conductive line swings from the Vcc to the Vss following the voltage swing at the bit-line during the write operation.

16. The SRAM cell array structure of claim 14, wherein the first conductive line is substantially parallel to the bit-lines.

17. The SRAM cell array structure of claim 14 further comprises a second conductive line placed between the conductive line and one of the bit-lines and spanning across the column of SRAM cells without making conductive coupling thereto, the second conductive line being formed by the first metal layer.

18. The SRAM cell array structure of claim 17, wherein during a write operation, voltage at the second conductive line stays at a high voltage (Vcc) while the first conductive line swings from the Vcc to a low voltage (Vss).

* * * * *